(12) United States Patent
Chen et al.

(10) Patent No.: US 10,007,032 B2
(45) Date of Patent: Jun. 26, 2018

(54) EXPOSURE DEVICE

(71) Applicant: BOE TECHNOLOGY GROUP CO., LTD., Beijing (CN)

(72) Inventors: Shantao Chen, Beijing (CN); Chienhung Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/159,197

(22) Filed: May 19, 2016

(65) Prior Publication Data
US 2016/0349622 A1    Dec. 1, 2016

(30) Foreign Application Priority Data
Jun. 1, 2015    (CN) .......................... 2015 1 0294077

(51) Int. Cl.
G03B 27/54    (2006.01)
G02B 3/00    (2006.01)
G03F 7/20    (2006.01)

(52) U.S. Cl.
CPC ....... *G02B 3/0006* (2013.01); *G03F 7/70275* (2013.01)

(58) Field of Classification Search
CPC .. G02B 3/0006; G03F 7/7015; G03F 7/70275
See application file for complete search history.

(56) References Cited

U.S. PATENT DOCUMENTS

| | | | | |
|---|---|---|---|---|
| 7,932,993 B2* | 4/2011 | Mei | ........................ | G03B 27/54 349/29 |
| 9,417,519 B2* | 8/2016 | Mulkens | ................... | G03F 1/70 |
| 2003/0122091 A1* | 7/2003 | Almogy | ................ | B82Y 10/00 250/492.24 |
| 2005/0024477 A1* | 2/2005 | Noguchi | .................. | B41J 2/465 347/241 |

(Continued)

FOREIGN PATENT DOCUMENTS

| | | |
|---|---|---|
| CN | 103837981 A | 6/2014 |
| CN | 103838080 A | 6/2014 |
| JP | 2014146660 A | 8/2014 |

OTHER PUBLICATIONS

Notification of the First Office Action dated Jul. 29, 2016 corresponding to Chinese application No. 201510294077.9.

*Primary Examiner* — Deoram Persaud
(74) *Attorney, Agent, or Firm* — Nath, Goldberg & Meyer; Joshua B. Goldberg

(57) ABSTRACT

The present invention discloses an exposure device including: a mask plate, on which a mask pattern is provided; and a first micro lens layer, provided at a light outputting side of the mask plate, wherein the first micro lens layer utilizes light that passes through the mask plate to form a reduced real image of the mask pattern, the real image is located at one side of the first micro lens layer, and the mask plate is located at other side of the first micro lens layer. In the present invention, by utilizing the characteristics of micro lenses, a reduced real image for the mask patter is formed (Continued)

and then projected onto the substrate to be exposed, which effectively increases precision and resolution of exposure and reduces equipment cost and development cost.

17 Claims, 2 Drawing Sheets

(56) References Cited

U.S. PATENT DOCUMENTS

| | | | |
|---|---|---|---|
| 2009/0021716 A1* | 1/2009 | Wangler | G03F 7/70075 355/67 |
| 2010/0248155 A1 | 9/2010 | Shim et al. | |
| 2012/0218537 A1* | 8/2012 | Mizumura | G03F 1/14 355/53 |
| 2013/0135602 A1* | 5/2013 | Mizumura | G03F 7/2002 355/67 |
| 2013/0141704 A1* | 6/2013 | Mizumura | G03F 7/70275 355/44 |
| 2013/0188161 A1* | 7/2013 | Kajiyama | G02B 3/0062 355/55 |
| 2013/0208255 A1* | 8/2013 | Mizumura | G03F 7/70258 355/71 |
| 2013/0342820 A1* | 12/2013 | Kajiyama | G03F 7/70358 355/67 |
| 2014/0295354 A1 | 10/2014 | Lee et al. | |
| 2015/0286144 A1* | 10/2015 | Zeng | G02B 3/0037 355/71 |
| 2016/0109808 A1* | 4/2016 | Zeng | G03F 7/70058 355/67 |
| 2018/0074278 A1* | 3/2018 | Fritzsche | G02B 7/003 |

* cited by examiner

EXPOSURE DEVICE

FIELD OF THE INVENTION

The present invention relates to the field of display panel manufacturing technology, and in particular relates to an exposure device.

BACKGROUND OF THE INVENTION

With the development of display technology, the requirement for the resolution of a display apparatus is increasing. However, in the process of manufacturing a display panel, because of the limitation by factors such as the cost of exposure apparatus and design specifications of mask plate and the like, improving precision and resolution of exposure process is very difficult and usually spend a huge cost of development and manufacture.

SUMMARY OF THE INVENTION

An objective of the present invention is to provide an exposure device to improve the precision of exposure and reduce the cost.

In order to solve the above technical problem, an embodiment of the invention provides an exposure device. The exposure device includes: a mask plate, on which a mask pattern is provided; and a first micro lens layer, provided at a light outputting side of the mask plate. The first micro lens layer utilizes light that passes through the mask plate to form a reduced real image of the mask pattern, the real image is located at one side of the first micro lens layer, and the mask plate is located at another side of the first micro lens layer.

Alternatively, the first micro lens layer comprises a plurality of first micro lenses, the plurality of first micro lenses are convex lenses, and the real image is an inverted reduced real image.

Alternatively, the plurality of first micro lenses are connected in sequence and arranged in an array.

Alternatively, the exposure device further includes a second micro lens layer, provided at a light outputting side of the first micro lens layer, wherein the real image is formed between the first micro lens layer and the second micro lens layer, and the second micro lens layer is used for causing the light that forms the real image to be outputted uniformly.

Alternatively, the second micro lens layer comprises a plurality of second micro lenses, the second micro lens comprises a second upper micro lens and a second lower micro lens integrated with each other, and a focal length of the second upper micro lens is different from a focal length of the second lower micro lens so as to cause the light that forms the real image to be outputted uniformly.

Alternatively, the plurality of second micro lenses are connected in sequence and arranged in an array.

Alternatively, a distance between the real image and the second micro lens layer is equal to the focal length of the second upper micro lens.

Alternatively, the second micro lens layer is a compound eye micro lens array.

Alternatively, the exposure device further includes a projection lens, provided at a light outputting side of the first micro lens layer, wherein the real image is formed between the first micro lens layer and the projection lens. If the exposure device further includes the above described second micro lens layer, then the projection lens is provided at a light outputting side of the second micro lens layer. The projection lens is used for projecting the real image onto a substrate to be exposed.

Alternatively, the projection lens projects the real image, with a same-sized or down-sized projection scale, onto the substrate to be exposed.

Alternatively, the mask plate includes a transparent substrate; the mask pattern is provided at one side of the transparent substrate, and the first micro lens layer is bonded to another side of the transparent substrate.

In the present invention, by utilizing the characteristics of micro lenses, a reduced real image for the mask pattern is formed and then projected onto the substrate to be exposed, which effectively increases precision and resolution of exposure and reduces equipment cost and development cost.

BRIEF DESCRIPTION OF THE DRAWINGS

The drawings which constitute a part of the specification are used to provide a further understanding of the present invention, and are used to interpret the present invention along with the following specific implementations, but do not intend to limit the present invention.

Figure 1:
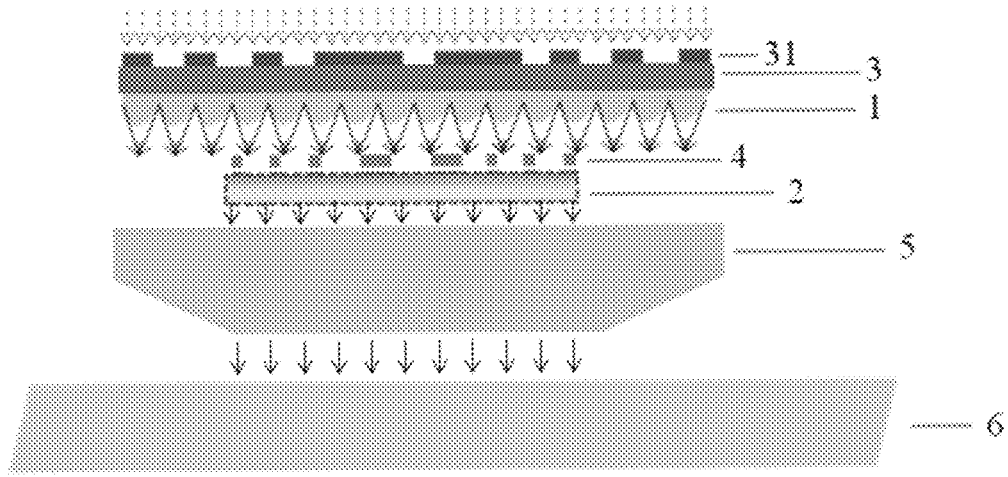
FIG. 1 is a schematic view of a structure of an exposure device in accordance with an embodiment of the present invention.

Reference numerals: 1—first micro lens layer; 11—first micro lens; 2—second micro lens layer; 21—second micro lens; 21a—second upper micro lens; 21b—second lower micro lens; 3—mask plate; 31—mask pattern; 4—real image; 5—projection lens; 6—substrate to be exposed.

DETAILED DESCRIPTION OF THE EMBODIMENTS

Specific implementations of the present invention will be described in detail below in conjunction with the drawings. It is to be understood that specific implementations described herein are used only to illustrate and interpret the present invention, rather than to limit the present invention.

The present invention provides an exposure device. As illustrated in FIG. 1, the exposure device includes: a mask plate 3, on which a mask pattern 31 is provided; and a first micro lens layer 1, provided at a light outputting side of the mask plate 3 (the arrow in FIG. 1 indicates the direction of light propagation). The first micro lens layer 1 utilizes the light that passes through the mask plate 3 to form a reduced real image 4 of the mask pattern 31, the real image 4 is located at one side of the first micro lens layer 1, and the mask plate 3 is located at the other side of the first micro lens layer 1.

In the present invention, with the first micro lens layer 1, the characteristics of micro lenses are utilized so that a reduced real image for the mask pattern 31 is formed and then projected onto the substrate to be exposed 6. Thus, precision and resolution of the exposure are increased without changing the design of the mask plate and main components of the exposure machine, and thereby the capability of exposing process is improved and apparatus cost and development cost are reduced.

On the other hand, because the size of the mask pattern 31 is greater than that of the real image 4, the exposure device provided by the present invention can obtain an exposure pattern with a smaller size and a finer structure using a mask pattern 31 with a larger size. Apparently, it is easier to fabricate a mask pattern 31 with a larger size, and the process cost is lower.

Figure 2:
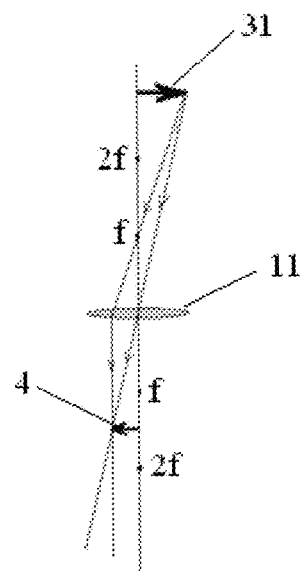
FIG. 2 is a schematic view of a first micro lens in accordance with an embodiment of the present invention.

Specifically, the first micro lens layer 1 may include a plurality of first micro lenses 11, and the first micro lens 11 may be a convex lens, as shown in FIG. 2. Generally, focal length f of the first micro lens 11 is very small, in the order of about a few microns to tens of microns, while the distance of the mask pattern 31 from the first micro lens 11 underneath (i.e. object distance of the convex lens) is at least in the order of millimeters. According to the laws of optical imaging, when the object distance is greater than twice of the focal length, an inverted reduced real image is formed at the other side of the convex lens. That is, the real image 4 of the mask pattern 31 formed between the first micro lens layer 1 and the second micro lens layer 2 is an inverted reduced real image.

Specifically, the plurality of the first micro lens 11 may be connected in sequence and arranged in an array, to make the image of the mask pattern 31 clearer.

Further, the exposure device may also include a second micro lens layer 2, provided at a light outputting side of the first micro lens layer 1. The real image 4 is formed between the first micro lens layer 1 and the second micro lens layer 2, and the second micro lens layer 2 is used for causing the light that forms the real image 4 to be outputted uniformly.

The term "uniform" here means that the light is parallel light, and the brightness thereof is uniformly distributed. It can be seen from FIG. 1 that the light is in a converging state after passing through the first micro lens layer 1, and become parallel light so as to be outputted after passing through the second micro lens layer 2, so that the energy of the light is distributed more uniformly, which is favorable for making the exposure more uniform.

Figure 3:
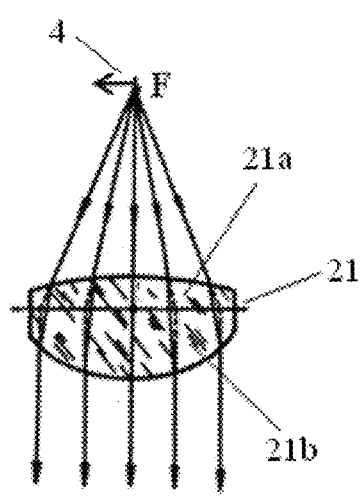
FIG. 3 is a schematic view of a second micro lens in accordance with an embodiment of the present invention.

Specifically, similar to the first micro lens layer, the second micro lens layer 2 may include a plurality of second micro lenses 21. The structure of the second micro lens 21 is shown in FIG. 3. The second micro lens 21 may include a second upper micro lens 21a and a second lower micro lens 21b that are integrated with each other, and the focal length of the second upper micro lens 21a is different from that of the second lower micro lens 21b so as to cause the light that forms the real image 4 to be outputted uniformly.

Specifically, the plurality of the second micro lenses 21 may be connected in sequence and arranged in an array so as to make the image of the mask pattern 31 clearer.

As an embodiment, the focal length of the second upper micro lens 21a is generally greater than the focal length of the second lower micro lens 21b, and the distance between the real image 4 and the second micro lens layer 2 is equal to the focal length of the second upper micro lens 21a. Taking FIG. 3 as an example, the real image 4 of the mask pattern 31 formed by the first micro lens 11 is located at the position of the focal point F of the second upper micro lens 21a so that the light can be outputted in parallel after passing through the second micro lens layer 2, which further satisfies the uniformity requirement of the exposure process.

It should be noted that there is no particular requirement regarding to the focal length f of the first micro lens 11 (i.e. convex lens) in the present invention, as long as the image of the mask pattern 31 can be formed at the focal point F of the second upper micro lens 21a.

As another embodiment, the second micro lens layer 2 may employ a compound eye micro lens array. The compound eye micro lens array is a micro lens array designed by simulating compound eyes of insects. The function of the compound eye micro lens array is to cause non-uniform light to become uniform after passing it through. Thus it may be used as the second micro lens layer 2 in the present invention.

Further, as illustrated in FIG. 1, the exposure device may also include projection lens 5, provided at a light outputting side of the first micro lens layer 1, and the real image 4 is located between the first micro lens layer 1 and the projection lens 5. If the exposure device also includes the second micro lens layer 2, projection lens 5 is then provided at a light outputting side of the second micro lens layer 2. The projection lens 5 is used for projecting the real image 4 onto a substrate to be exposed 6. The projection lens 5 is usually formed of multiple sets of lenses with different focal lengths that are integrated together, and is frequently used in exposure apparatuses. The projection lens 5 can further improve collimation properties of light, thereby increasing uniformity of energy distribution of light and improving exposure effect.

It should be noted that the projection scale (or projection ratio) of the projection lens 5 is not limited in the present invention. As an embodiment, the projection lens 5 may project the real image 4, with a same-sized or down-sized projection scale, onto the substrate to be exposed 6.

A more common case is that the projection lens 5 projects the real image 4 with a projection scale of 1:1 onto the substrate to be exposed 6, to ensure the projected image clearer. Alternatively, the projection lens 5 projects the real image 4 onto the substrate to be exposed 6 after down-sizing the real image 4. For example, the projection lens 5 projects the real image 4 with a projection scale of 5:1 or 4:1 onto the substrate to be exposed 6, to further enhance process capability of the exposure device and increase resolution and precision of the exposure.

Further, the mask plate 3 may include a transparent substrate. The mask pattern 31 is provided at a side of the transparent substrate, and the first micro lens layer 1 is bonded to the other side of the transparent substrate.

To summarize, in the present invention, by utilizing the characteristics of the first micro lens layer 1 and the second micro lens layer 2, a reduced real image 4 of the mask pattern 31 is formed and then projected uniformly onto the substrate to be exposed 6. Thus, the capability of exposing process is improved without changing the design of the mask plate and main components of the exposure machine, and thereby apparatus cost and development cost are reduced.

It is to be understood that above implementations are exemplary implementations that are merely employed to illustrate the principle of the present invention, and the present invention is not limited thereto. For the ordinary skilled in the art, it is possible to make various variations and modifications without departing from the spirit and nature of the present invention, and these variations and modifications are also regarded as within the scope of protection of the present invention.

The invention claimed is:

1. An exposure device, comprising:
   a mask plate, on which a mask pattern is provided;
   a first micro lens layer, provided at a light outputting side of the mask plate, wherein the first micro lens layer utilizes light that passes through the mask plate to form a reduced real image of the mask pattern, the real image is located at one side of the first micro lens layer, and the mask plate is located at another side of the first micro lens layer; and a second micro lens layer, provided at a light outputting side of the first micro lens layer, wherein the real image is formed between the first micro lens layer and the second micro lens layer, and the second micro lens layer is used for causing the light that forms the real image to be outputted uniformly.

2. The exposure device according to claim 1, wherein the first micro lens layer comprises a plurality of first micro lenses, the plurality of first micro lenses are convex lenses, and the real image is an inverted reduced real image.

3. The exposure device according to claim 2, further comprising a projection lens, provided at a light outputting side of the first micro lens layer, wherein the real image is formed between the first micro lens layer and the projection lens, and the projection lens is used for projecting the real image onto a substrate to be exposed.

4. The exposure device according to claim 2, wherein the plurality of first micro lenses are connected in sequence and arranged in an array.

5. The exposure device according to claim 4, further comprising a projection lens, provided at a light outputting side of the first micro lens layer, wherein the real image is formed between the first micro lens layer and the projection lens, and the projection lens is used for projecting the real image onto a substrate to be exposed.

6. The exposure device according to claim 1, wherein the second micro lens layer comprises a plurality of second micro lenses, the second micro lens comprises a second upper micro lens and a second lower micro lens integrated with each other, and a focal length of the second upper micro lens is different from a focal length of the second lower micro lens so as to cause the light that forms the real image to be outputted uniformly.

7. The exposure device according to claim 6, wherein the plurality of second micro lenses are connected in sequence and arranged in an array.

8. The exposure device according to claim 7, further comprising a projection lens, provided at a light outputting side of the second micro lens layer, wherein the projection lens is used for projecting the real image onto a substrate to be exposed.

9. The exposure device according to claim 6, wherein a distance between the real image and the second micro lens layer is equal to the focal length of the second upper micro lens.

10. The exposure device according to claim 9, further comprising a projection lens, provided at a light outputting side of the second micro lens layer, wherein the projection lens is used for projecting the real image onto a substrate to be exposed.

11. The exposure device according to claim 6, wherein the second micro lens layer is a compound eye micro lens array.

12. The exposure device according to claim 11, further comprising a projection lens, provided at a light outputting side of the second micro lens layer, wherein the projection lens is used for projecting the real image onto a substrate to be exposed.

13. The exposure device according to claim 6, further comprising a projection lens, provided at a light outputting side of the second micro lens layer, wherein the projection lens is used for projecting the real image onto a substrate to be exposed.

14. The exposure device according to claim 1, further comprising a projection lens, provided at a light outputting side of the first micro lens layer, wherein the real image is formed between the first micro lens layer and the projection lens, and the projection lens is used for projecting the real image onto a substrate to be exposed.

15. The exposure device according to claim 14, wherein the projection lens projects the real image, with a same-sized or down-sized projection scale, onto the substrate to be exposed.

16. The exposure device according to claim 1, further comprising a projection lens, provided at a light outputting side of the second micro lens layer, wherein the projection lens is used for projecting the real image onto a substrate to be exposed.

17. The exposure device according to claim 1, wherein the mask plate comprises a transparent substrate, the mask pattern is provided at one side of the transparent substrate, and the first micro lens layer is bonded to another side of the transparent substrate.

* * * * *